(12) United States Patent  
Connors et al.

(10) Patent No.: US 6,588,624 B1
(45) Date of Patent: Jul. 8, 2003

(54) COVER DAMPING MECHANISM

(75) Inventors: William Michael Connors, Lexington, KY (US); Nolan Francis Luckett, Versailles, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/577,907

(22) Filed: May 24, 2000

(51) Int. Cl.⁷ ............................ B41J 29/13; B41J 29/02; E05D 11/08
(52) U.S. Cl. ................... 220/827; 220/830; 220/831; 400/693; 16/341
(58) Field of Search ..................... 220/4.02, 827, 220/840, 831, 833, 810, 830; 16/341; 267/134; 400/693, 691

(56) References Cited

U.S. PATENT DOCUMENTS

| | | | |
|---|---|---|---|
| 3,685,093 A | | 8/1972 | Sanders et al. |
| 4,114,236 A | * | 9/1978 | Vandervort ................... 16/142 |
| 4,672,715 A | | 6/1987 | Beckwith |
| 4,850,081 A | * | 7/1989 | Grant ........................... 16/257 |
| 4,879,786 A | | 11/1989 | Olson |
| 4,993,772 A | * | 2/1991 | Charen ....................... 296/97.1 |
| 5,109,573 A | * | 5/1992 | Sherman ....................... 16/341 |
| 5,413,317 A | * | 5/1995 | Spoerre ....................... 267/134 |
| 5,516,219 A | | 5/1996 | Leonard et al. |
| 5,570,962 A | | 11/1996 | Suzuki et al. |
| 5,737,805 A | | 4/1998 | Xiao |
| 5,746,520 A | | 5/1998 | Kohira |
| 5,775,825 A | | 7/1998 | Hong et al. |
| 5,790,162 A | | 8/1998 | Adams et al. |
| 6,003,925 A | * | 12/1999 | Litke et al. ................. 296/37.8 |
| 6,135,530 A | * | 10/2000 | Blaszczak et al. ............ 16/286 |
| 6,244,647 B1 | * | 6/2001 | Allison ..................... 296/37.12 |

FOREIGN PATENT DOCUMENTS

| | | | | |
|---|---|---|---|---|
| DE | 4125184 A1 | * | 2/1993 | ............ B60N/3/02 |
| JP | 2000-97227 | * | 4/2000 | |

* cited by examiner

*Primary Examiner*—Daniel J. Colilla
(74) *Attorney, Agent, or Firm*—Elizabeth C. Jacobs; Jacqueline M. Daspit; Steven J. Elleman

(57) ABSTRACT

A damping mechanism for use with a housing having a body and a cover pivotably attached to the body, the cover being movable between an open position and a closed position. The damping mechanism includes a body engagement surface located on the body and a cover engagement surface located on the cover. One of the body engagement surface or the cover engagement surface includes a generally planar damping pad and the other of the body engagement surface or the cover engagement surface includes a cam having a generally curved cam surface. The cam surface is shaped and positioned to engage the damping pad such that the damping pad and the cam cooperate to damp the movement of the cover when the cover pivots between the open and closed positions.

12 Claims, 9 Drawing Sheets

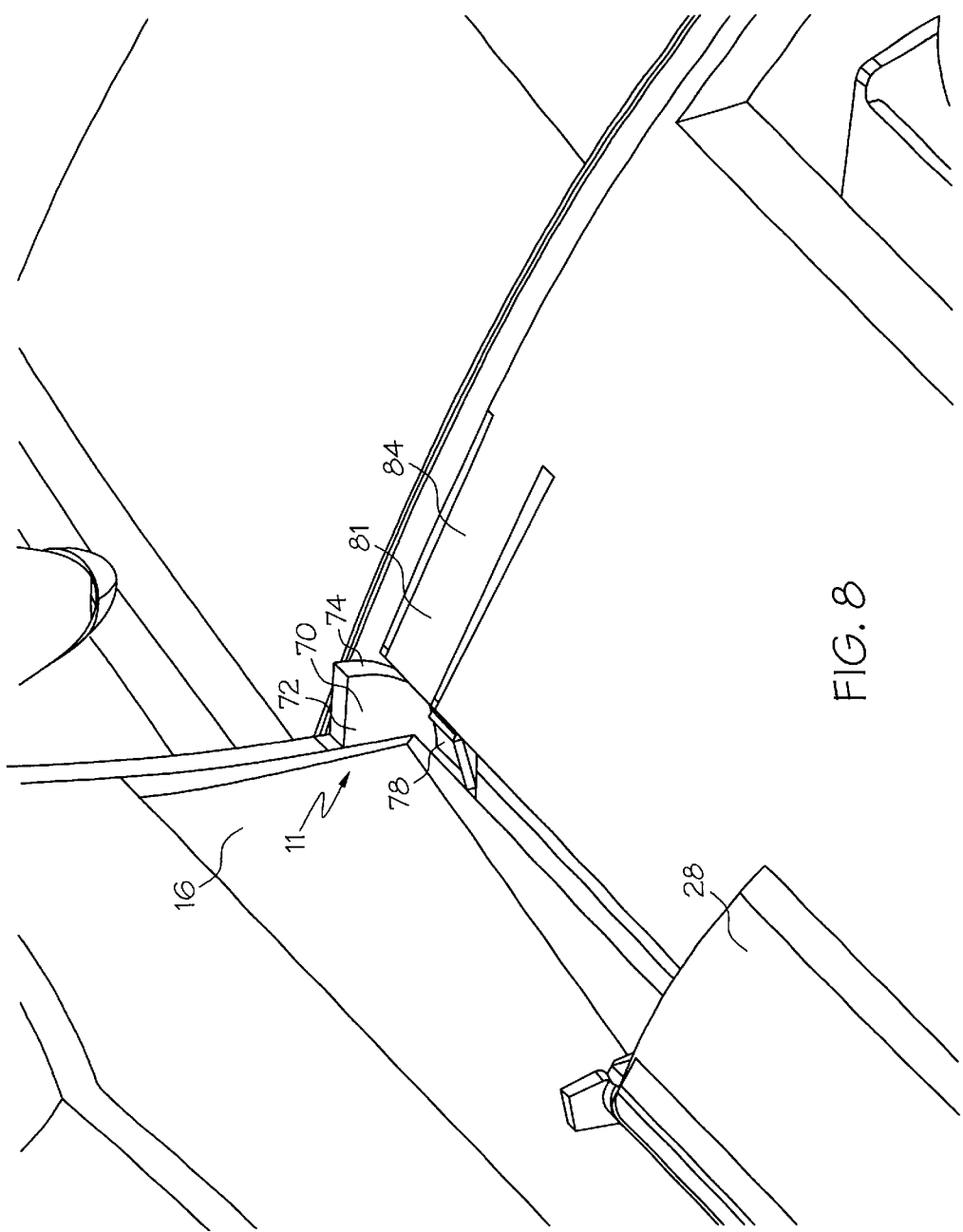

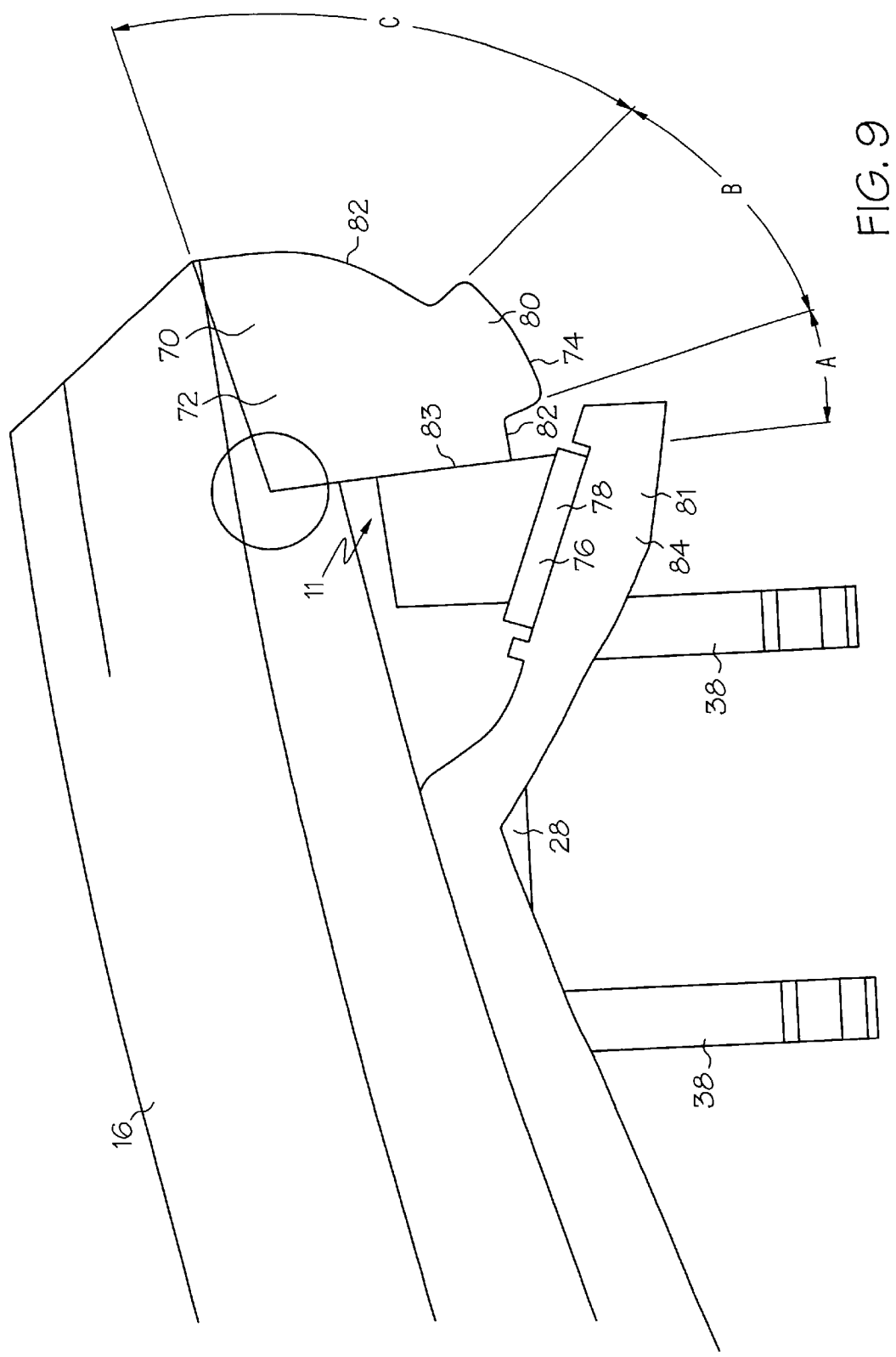

COVER DAMPING MECHANISM

BACKGROUND OF INVENTION

The present invention is directed to damping mechanisms, and more particularly, to damping mechanisms for use with hinged covers of housings and other enclosures.

Electronic devices, such as printers, copiers, facsimile machines, scanners, CD players and the like typically include a body that provides structural integrity to the device. In order to provide access to the internal components of the device, the body typically includes an access opening that is protected by a movable cover. The cover is movable between an open position and a closed position such that the internal components of the device can be accessed through the access opening. The cover may be biased in either the open or closed position, and a detent mechanism may be used to maintain the cover in its non-biased position. Various mechanisms, such as springs, air/hydraulic piston assemblies, or gravity may be used to bias the cover in the open or closed positions. However, the biasing mechanisms may not provide for a smooth, controlled opening or closing motion of the access cover. Accordingly, there is a need for a damping mechanism that damps the motion of the cover of an electronic device.

SUMMARY OF THE INVENTION

The present invention is a damping mechanism which can be used to damp the movement of a cover of a housing, such an electronic device. The damping mechanism includes a cam having a generally curved cam surface that is shaped to engage a generally planar damping surface. The damping pad and cam cooperate to slow the opening or closing motion of the cover.

In a preferred embodiment, the invention is a damping mechanism for use with a housing having a body and a cover pivotably attached to the body, the cover being movable between an open position and a closed position. The damping mechanism includes a body engagement surface located on the body and a cover engagement surface located on the cover. One of the body engagement surface or the cover engagement surface includes a generally planar damping pad and the other of the body engagement surface or the cover engagement surface includes a cam having a generally curved cam surface. The cam surface is shaped and positioned to engage the damping pad such that the damping pad and the cam cooperate to damp the movement of the cover when the cover pivots between the open and closed positions.

Accordingly, it is an object of the present invention to provide a damping mechanism for a cover of an electronic device that is robust and durable. Other objects and advantages of the present invention will be apparent from the following description and the accompanying drawings.

BRIEF DESCRIPTION OF THE DRAWINGS

FIG. 8 is an detail perspective view showing an alternative mounting arrangement for the damping pad of the damping mechanism of the present invention; and FIG. 9 is a side view of an embodiment of the damping mechanism of the present invention.

DETAILED DESCRIPTION

Figure 1:
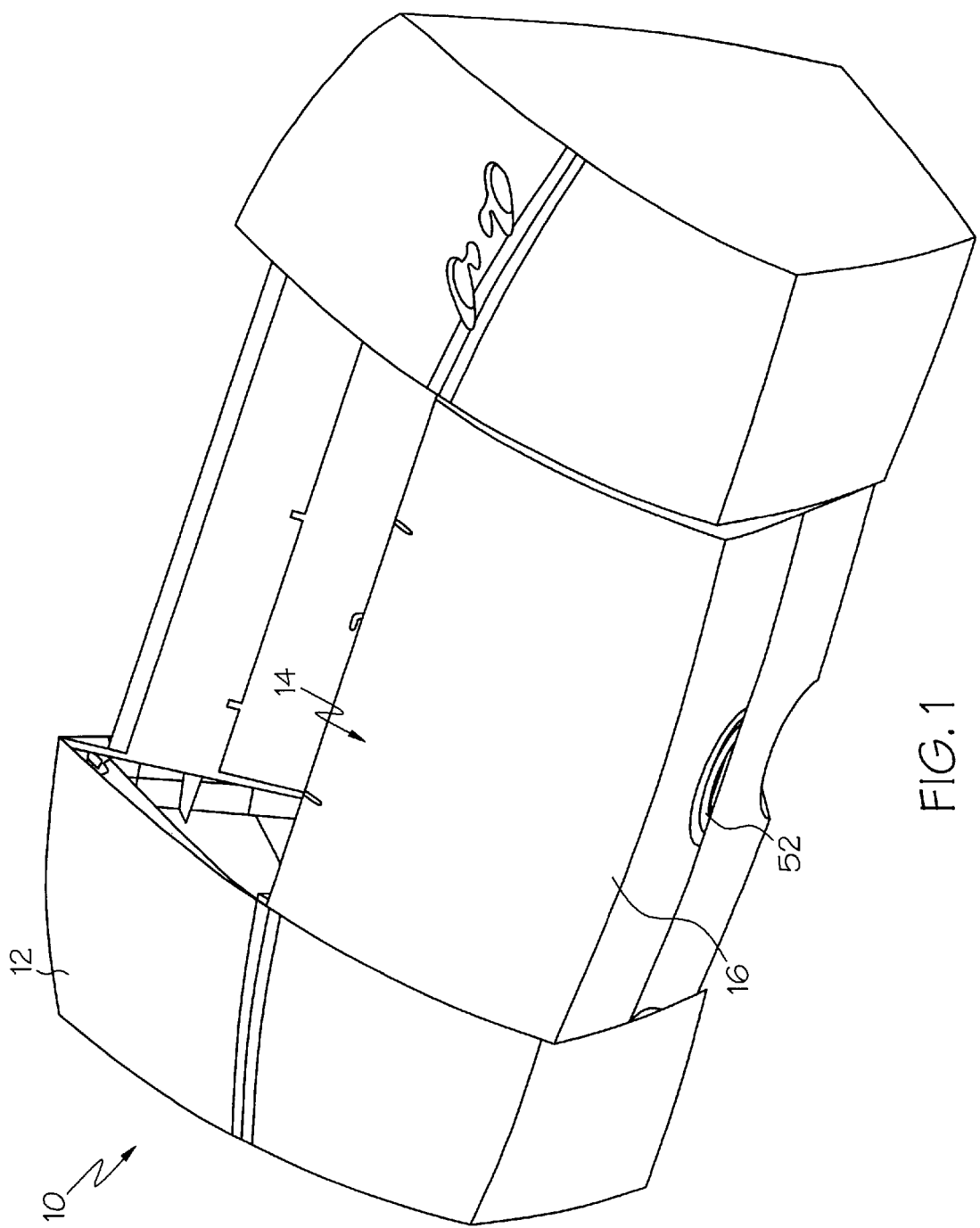
FIG. 1 is an upper perspective view of a printer including one embodiment of the damping mechanism of the present invention, with the cover in the closed position.
Figure 2:
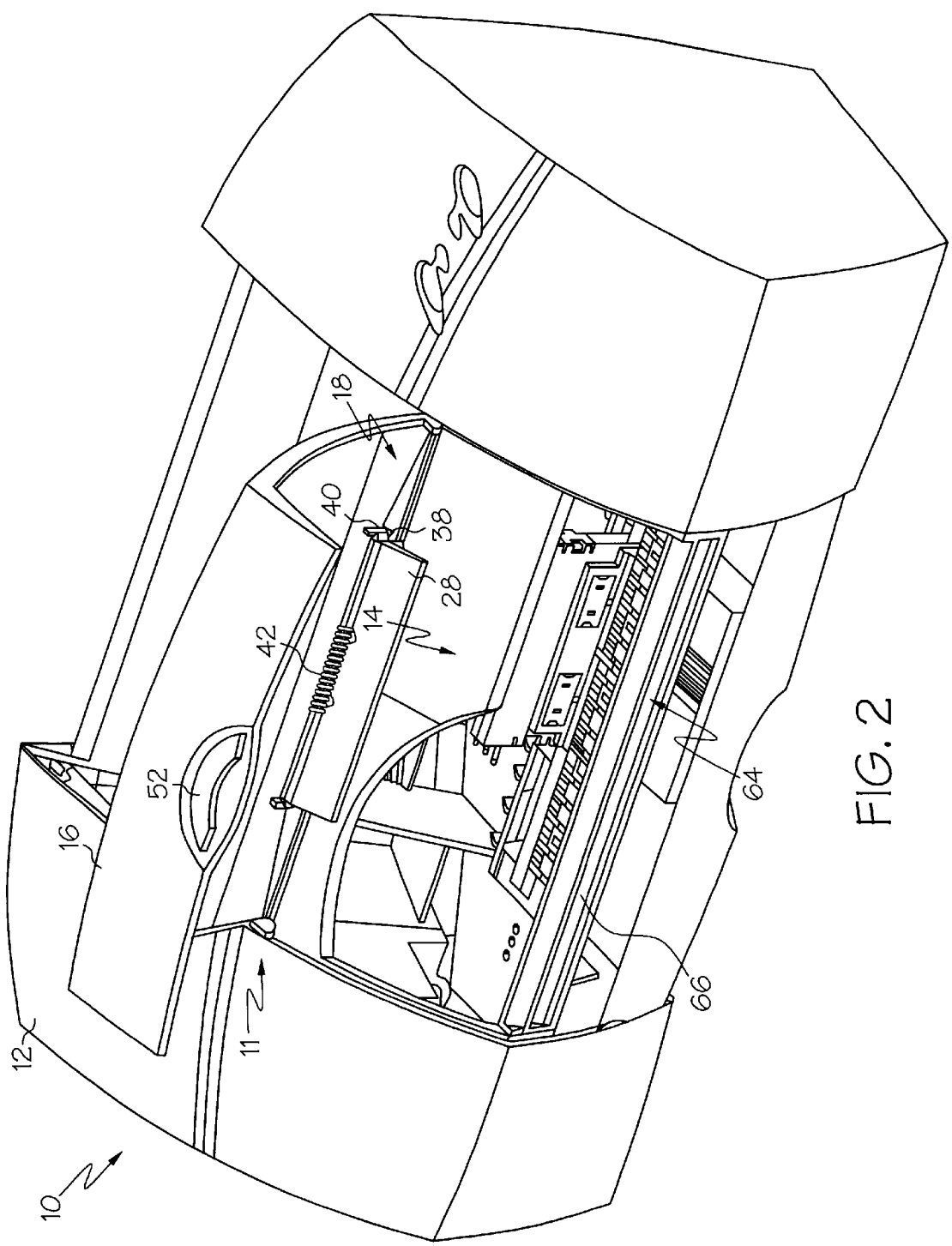
FIG. 2 is an upper perspective view of the printer of FIG. 1, with the cover in the open position.

As shown in FIGS. 1 and 2, the damping mechanism 11 of the present invention may be used in a business machine, such as a printer or housing 10 having a body 12. The body 12 includes an access opening 14 that is selectively covered by a cover 16. The cover 16 is pivotably coupled to the body 12 by a hinge mechanism 18. In this manner, the cover 16 is moveable between a closed position (FIG. 1) and an open position FIG. 2).

Figure 3:
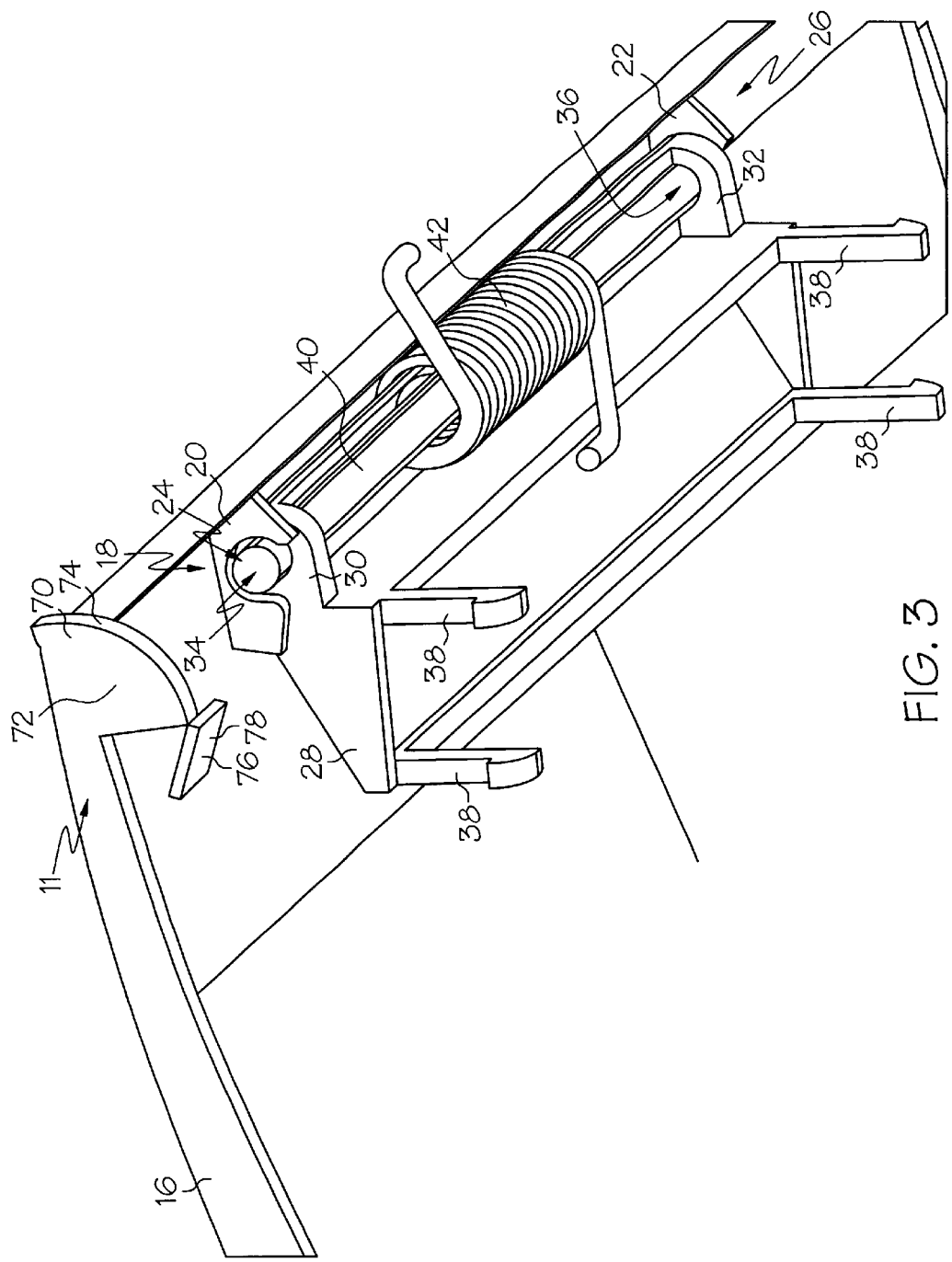
FIG. 3 is a lower perspective view of the damping mechanism of the printer of FIGS. 1 and 2.

As best shown in FIG. 3, the cover 16 includes a cover engagement surface 70. In the illustrated embodiment the cover engagement surface 70 is a cam 72 having a cam surface 74 that is generally curved in side view. The cam 72 can be made from a variety of materials, preferably plastics, such as high impact polystyrene. In the illustrated embodiment the cam 72 is integral with the cover 16, and is generally shaped as a portion of a circle in top view. The body 12 includes a body engagement surface 76 that is shaped and located to engage the cover engagement surface 70. Although FIG. 3 does not illustrate the body engagement surface 76 as being coupled to the body 12, various mechanisms (such as adhesives, clamps, fasteners, interference fits, etc.) known to those of ordinary skill may be used, although a preferred manner for mounting the body engagement surface 76 to the body is illustrated and discussed below. In the illustrated embodiment the body engagement surface 76 is generally planar damping pad 78, although other shapes of damping pads may be used. For example, the damping pad may be curved to match the curvature of the cover engagement surface. The damping pad 78 may be made from a variety of materials, but is preferably made of a resilient compressible material which provide high friction forces when the damping pad 78 engages the cam 72. The damping pad 78 is preferably made of a thermal plastic elastomer, such as SANTOPRENE 101-55.

Figure 4:
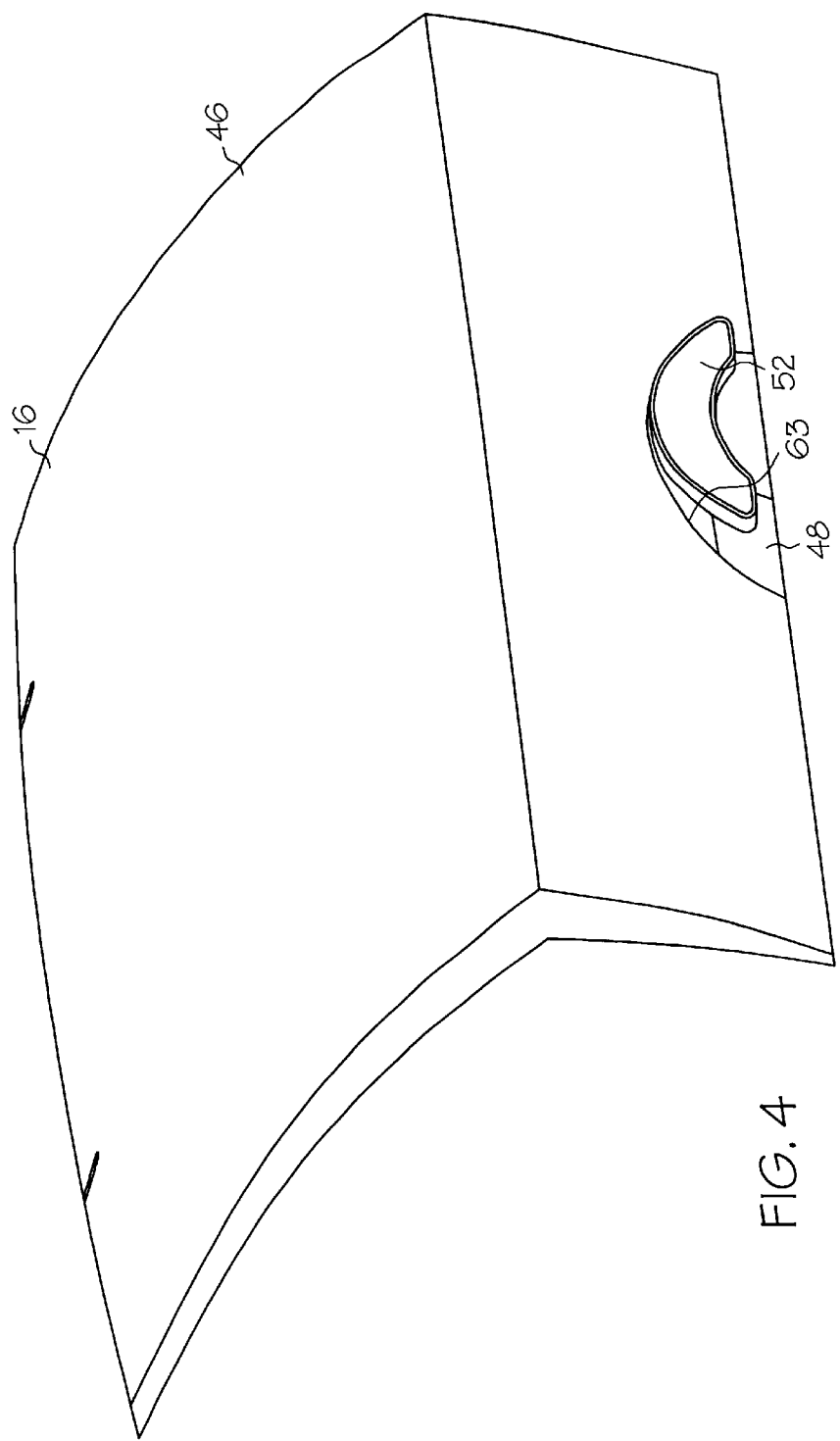
FIG. 4 is an upper perspective view of the cover of the printer of FIG. 1.
Figure 5:
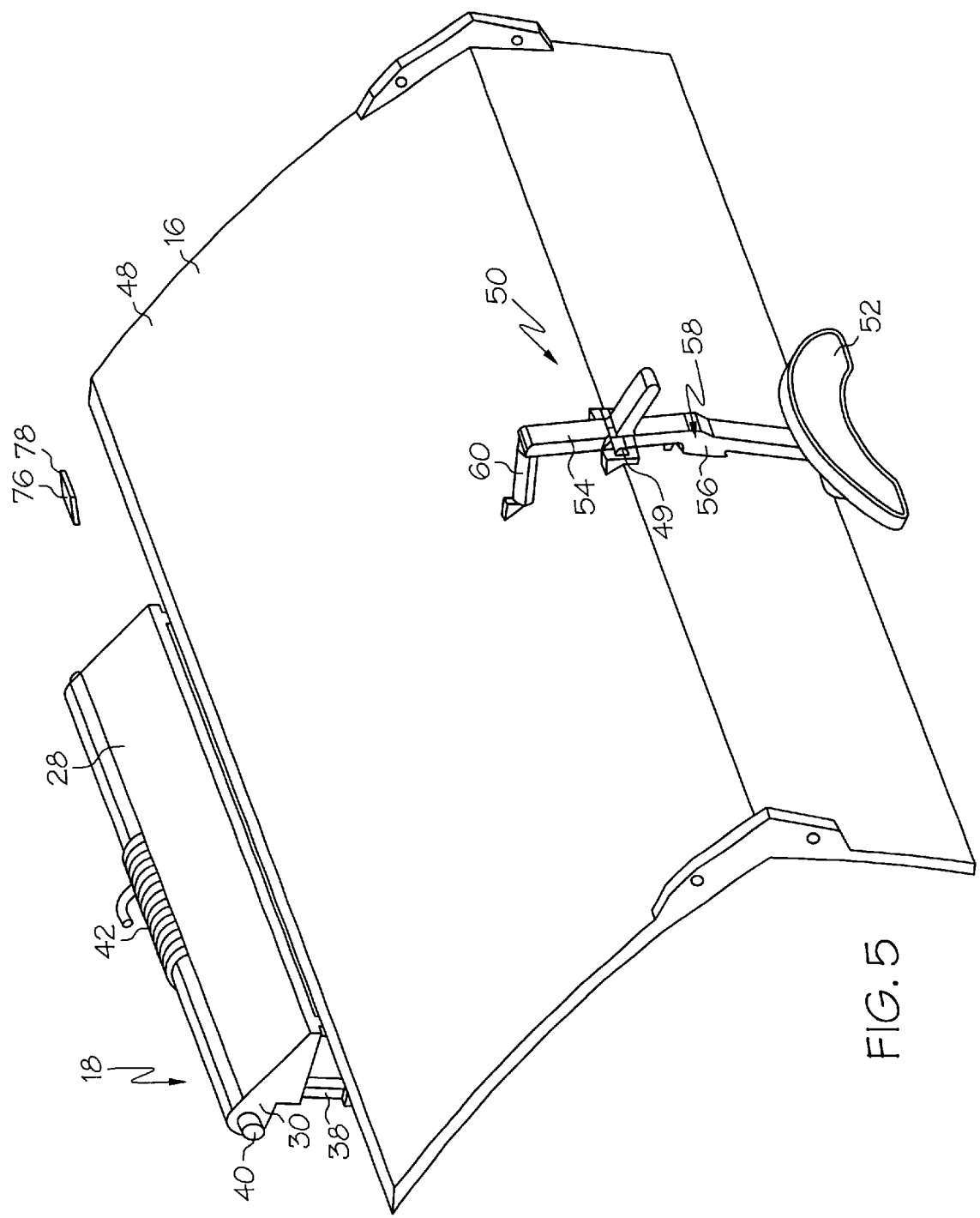
FIG. 5 is an upper perspective view of the cover of FIG. 4, with the outer shell removed.

As shown in FIG. 4, the cover 16 includes an outer shell 46 and an inner shell 48. A latch assembly 50 (FIG. 5) is located between the outer shell 46 and the inner shell 48. The latch assembly 50 includes a handle 52, an arm 54 and a catch 56. The arm 54 is pivotably mounted to the inner shell 48 at pivot point 49, and the catch 56 is aligned with an opening 58 in the inner shell. The upper end of the arm 54 is coupled to a latch spring 60 that extends between the inner shell 48 and the arm 54. As shown in FIG. 4, the outer shell 46 of the cover 16 substantially covers the latch assembly 50, and includes a indentation 63 to receive the handle 52.

Figure 6:
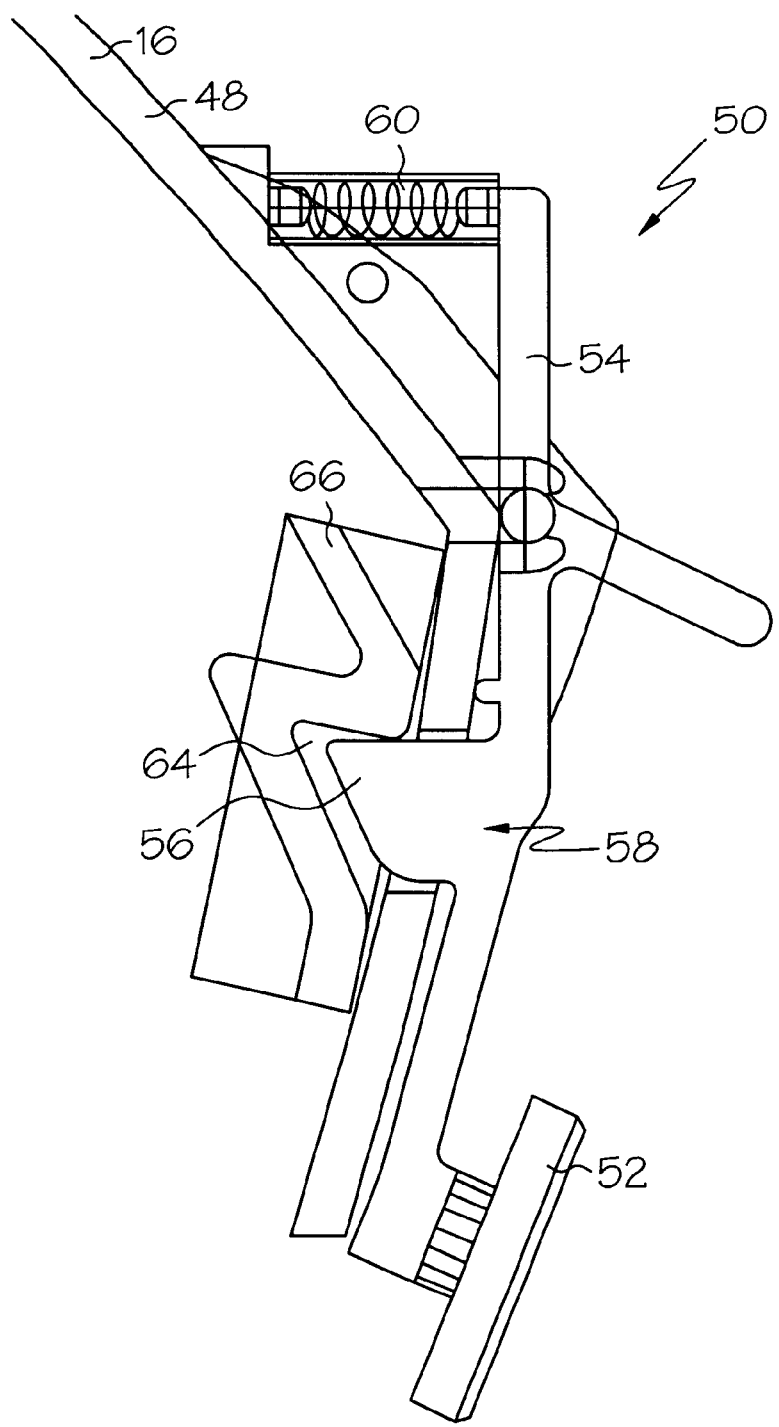
FIG. 6 is a side view the latch mechanism of the printer of FIG. 1, with the outer shell removed, the latch shown in the engaged position.
Figure 7:
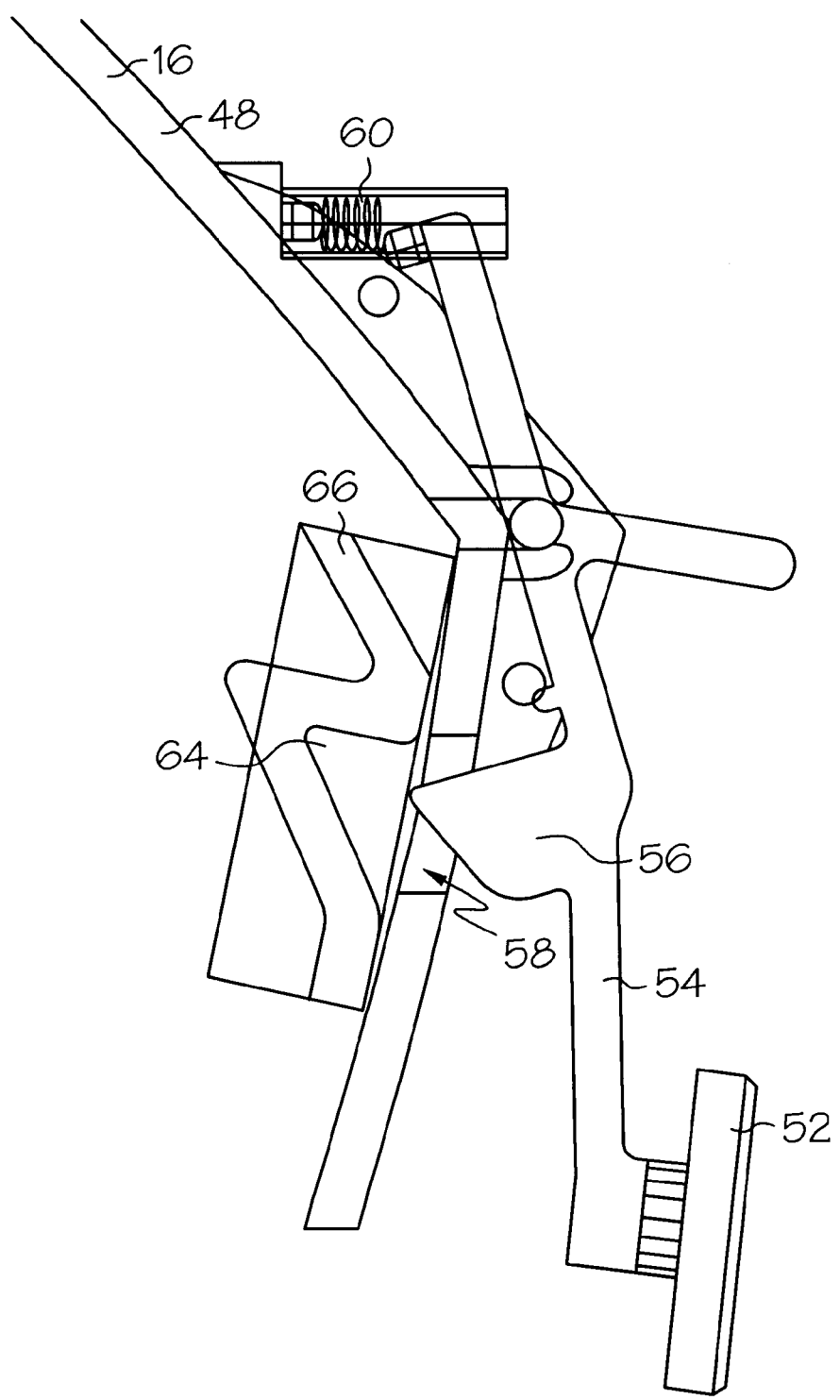
FIG. 7 is a side view of the latch mechanism of the printer of FIG. 1 with the outer shell removed and the latch shown in the disengaged position.

In order to lock the cover 16 in its closed position, the catch 56 extends through the opening 58 in the inner shell 48 and is received in a notch 64 in the front cover 66 of the body 12 (FIG. 6). When the catch 56 is received in the notch 64 (i.e., the latch assembly 50 is in its engaged position), the catch engages the top surface of notch 64 to maintain the cover 16 in its closed position. The latch assembly 50 is biased into its engaged position by the latch spring 60. When it is desired to move the cover 16 to its open position, the handle 52 is pulled to move the latch assembly 50 to its release position (shown in FIG. 7), compressing the latch spring 60. When the catch 56 is rotated clear of the notch 64, the cover 16 moves to its open position and as biased by the torsion spring 42.

As best shown in FIG. 3, the cover 16 includes a cover engagement surface 70. In the illustrated embodiment the cover engagement surface 70 is a cam 72 having a cam surface 74 that is generally curved in side view. The cam 72 can be made from a variety of materials, preferably plastics, such as high impact polystyrene. In the illustrated embodiment the cam 72 is integral with the cover 16, and is generally shaped as a portion of a circle in top view. The body 12 includes a body engagement surface 76 that is shaped and located to engage the cover engagement surface 70. Although FIG. 3 does not illustrate the body engagement surface 76 as being coupled to the body 12, various mechanisms (such as adhesives, clamps, fasteners, interference fits, etc.) known to those of ordinary skill may be used, although a preferred manner for mounting the body engagement surface 76 to the body is illustrated and discussed below. In the illustrated embodiment the body engagement surface 76 is generally planar damping pad 78, although other shapes of damping pads may be used. For example, the damping pad may be curved to match the curvature of the cover engagement surface. The damping pad 78 may be made from a variety of materials, but is preferably made of a resilient compressible material which provide high friction forces when the damping pad 78 engages the cam 72. The damping pad 78 is preferably made of a thermal plastic elastomer, such as Santoprene 101-55.

Once the latch assembly 50 is moved to its disengaged position, the cover 16 moves from its closed to its open position, as biased by the spring 42. As the cover 16 moves from its closed to its open position, the cam surface 74 engages the damping pad 78, and the frictional forces between the cam surface 74 and the pad 78 slow the opening movement of the cover 16. As shown in FIGS. 8–9, the damping pad 78 is preferably mounted onto a leaf spring 81 formed by cantilevered arm 84. In this manner, the leaf spring 81 biases the damping pad 78 against the cam 72 when the cam surface 74 first engages the damping pad 78. Thus, when the cam surface 74 first engages the damping pad, there is a relatively high amount of friction between the cam surface and the damping pad 78. However, as the cam 72 and damping pad 78 "compresses" the damping pad spring 81 (i.e., moves the cantilevered arm 84 radially outwardly), frictional forces between the cam 72 and the damping pad 78 are decreased. Thus, the damping forces of the damping mechanism 11 are highest when the cam 72 first engages the damping pad 78. This is desirable because the torsion spring 42 exert its highest opening forces during the initial opening movement of the cover 16, and therefore the strongest damping of the damping mechanism 11 corresponds to the strongest forces exerted by the torsion spring 42. After the damping pad spring 81 is "compressed," the friction forces between the damping pad 78 and the cam surface 74 result in a smooth, controlled opening motion of he access cover 16.

A wide variety of shapes, materials and mounting orientations may be used or the cam 72 and the damping pad 78 without departing from the scope of the invention. Furthermore, a variety of biasing mechanisms, such as a standard coil spring, may be used in place of the leaf spring 81 to bias the damping pad 78 against the cam surface. Further alternately, the cam surface 74 may be spring biased against the damping pad 78. In yet another alternate embodiment, the damping pad 72 is located on the cover 16 and the cam 72 is located on the body 12. In this case the cam 72 is stationary as the damping pad 72 moves with the cover 16 during its opening or closing motion.

When the cover 16 is moved from its open position to the closed position, the cam surface 74 and damping pad 78 may frictionally engage each other to oppose the closing motion of the cover 16. However, the frictional forces generated between the cam surface 74 and the damping pad 78 are relatively low compared to the biasing force of the torsion spring that must also be overcome to close the cover.

In a preferred embodiment, the damping mechanism 11 selectively damps the opening or closing motion of the cover 16. As shown in FIG. 9, the cam 72 may include a protrusion portion 80 that extends radially outwardly from a recessed portion 82 of the cam. In this case, the cam surface 74 is located on the outer surface of the protrusion portion 80. For example, the cam 72 may be generally shaped as a section of a circle in top view (such as a section extending for about 110° of a full circle). The protrusion portion 80 may protrude radially outwardly for about 30° of the full 110° of the cam 72, and be located about 10° from a lower edge 83 of the cam. Thus, for example, if the cover 16 moves about 110° when it moves from its closed position to its open position, the cam surface 74 engages the damping pad 78 for about 30° of the total 110° of travel. In the illustrated embodiment, the first 10° of rotational travel of the cam 72 (indicated by section A of FIG. 9) is undamped, the next 30° of travel (indicated by section B) is damped by the cooperation between the damping pad 78 and the cam surface 74, and the remaining 70° of travel (indicated by section C) is undamped.

The initial, undamped 10° of opening motion allows the cover 16 to quickly "spring" open to ensure that the catch 56 quickly clears the notch 64 when the latch mechanism 50 is moved to its disengaged position. The next 30° of opening motion of the cover 16 is damped, to provide a smooth, controlled opening motion of the cover 16. Of course, as noted above, relatively high damping forces are applied when the cam 72 first engages the damping pad 78. Finally, the remaining 60° of travel of the cover 16 is undamped because the force exerted by the torsion spring 42 at this portion of travel of the cover is relatively weak. In this manner, the cam 72 shown in FIG. 9 is shaped to provide different levels of damping as the cover 16 moves from the open position and the closed position to provide a smooth opening motion. Of course, the size and shape of the cam 72 or damping pad 78 may be varied to provide for a variety of damping profiles, as desired.

Having described the invention in detail and by reference to the preferred embodiments, it will be apparent that modifications and variations thereof are possible without departing from the scope of the invention.

What is claimed is:

1. A damping mechanism for use with a housing having a body and a cover pivotally attached to said body and being movable between an open position and a closed position, the damping mechanism comprising:

a body engagement surface located on the body; and a cover engagement surface located on the cover;

one of said body engagement surface or said cover engagement surface including a damping pad and the other of said body engagement surface or said cover engagement surface including a cam having a cam surface that is shaped and positioned to engage said damping pad such that said damping pad and said cam cooperate to damp the movement of said cover when said cover pivots between said open and closed positions wherein said cam surface is shaped to engage said damping pad during a damped portion of the movement of said cover between said open and closed positions and to not engage said damping pad during an undamped portion of the movement of said cover between said open and closed positions, wherein said cam surface is generally arcuate in side view and is located on a generally curved protrusion portion that engages said damping pad during said damped portion of movement of said cover.

2. The damping mechanism of claim 1 wherein said cam surface is shaped to not engage said damping pad when said cover is located adjacent said open position or said closed position.

3. The damping mechanism of claim 1 wherein at least one of said cover engagement surface or said body engagement surface is spring biased against the other of said cover engagement surface or said body engagement surface.

4. The damping mechanism of claim 3 further comprising a leaf spring, and wherein said one of said body engagement surface or cover engagement surface is mounted on the end of said leaf spring.

5. The damping mechanism of claim 1 wherein said damping pad frictionally engages said cam surface to slow the movement of said cover.

6. The damping mechanism of claim 1 wherein said cover is biased in said open position.

7. The damping mechanism of claim 6 further comprising a torsion spring located about a hinge that biases said cover in said open position.

8. The damping mechanism of claim 1 wherein said damping pad is an elastomer.

9. The damping mechanism of claim 1 wherein said body includes an access opening, and wherein said cover at least partially covers said access opening when said cover is in said closed position and wherein said cover does not cover said access opening when said cover is in said open position.

10. A damping mechanism for use with a housing having a body and a cover attached to said body such that said cover is pivotable about a pivot axis and is movable between an open position and a closed position, the damping mechanism comprising:

a body engagement surface located on the body; and a cover engagement surface located on the cover;

one of said body engagement surface or said cover engagement surface including a damping pad and the other of said body engagement surface or said cover engagement surface including a cam having a generally curved cam surface that is shaped and positioned to selectively engage said damping pad such that said damping pad and said cam cooperate to damp the movement of said cover when said cover pivots between said open and closed positions, said portion of said cam which engages said damping pad being concave with respect to said pivot axis.

11. A method for damping the opening motion of a cover of a housing, the method comprising the steps of:

providing a housing having a body including an access opening and a body engagement surface, and a cover for covering at least part of said access opening, said cover being pivotable about a pivot axis between an open position wherein said access opening is not covered by said cover and a closed position wherein said access opening is at least partially covered by said cover, said cover having a cover engagement surface, wherein one of said body engagement surface or said cover engagement surface includes a damping surface and the other of said body engagement surface or said cover engagement surface includes a cam having a generally curved cam surface shaped to engage said damping surface during a damped portion of the movement of said cover and to not engage said damping surface during an undamped portion of the movement of said cover, said portion of said cam surface which engages said damping surface being concave with respect to said pivot axis; and causing said cover to pivot about said pivot axis from said closed position to said open position such that said cam surface selectively engages said damping surface and wherein said damping pad and said cam cooperate to slow the movement of said cover.

12. A damping mechanism for use with a housing having a body having an opening and a cover pivotally attached to said body and being movable between an open position wherein said cover generally does not cover said opening and a closed position wherein said cover generally covers said opening, the damping mechanism comprising:

a body engagement surface located on the body; and a cover engagement surface located on the cover;

one of said body engagement surface or said cover engagement surface including a damping pad and the other of said body engagement surface or said cover engagement surface including a cam having a cam surface that is shaped and positioned to selectively engage said damping pad such that said damping pad and said cam cooperate to selectively damp the movement of said cover when said cover pivots between said open and closed positions, wherein said cam surface does not engage said damping pad when said cover is in or adjacent to said open or closed positions, and wherein said cam surface engages said damping pad at at least one position of said cover when said cover is located between said open and said closed positions.

* * * * *